United States Patent
Shinohara et al.

(10) Patent No.: US 9,577,004 B2
(45) Date of Patent: Feb. 21, 2017

(54) IMAGING APPARATUS, IMAGING SYSTEM AND MANUFACTURING METHOD OF IMAGING APPARATUS

(71) Applicant: CANON KABUSHIKI KAISHA, Tokyo (JP)

(72) Inventors: Mahito Shinohara, Tokyo (JP); Masahiro Kobayashi, Tokyo (JP); Masatsugu Itahashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/576,028

(22) Filed: Dec. 18, 2014

(65) Prior Publication Data

US 2015/0179688 A1 Jun. 25, 2015

(30) Foreign Application Priority Data

Dec. 25, 2013 (JP) .................... PCT/JP2013/084566

(51) Int. Cl.
*H01L 27/146* (2006.01)
*H01L 29/66* (2006.01)
*H01L 29/808* (2006.01)
*H01L 29/10* (2006.01)
*H01L 31/112* (2006.01)

(52) U.S. Cl.
CPC ... *H01L 27/14689* (2013.01); *H01L 27/14679* (2013.01); *H01L 29/1066* (2013.01); *H01L 29/66901* (2013.01); *H01L 29/808* (2013.01); *H01L 31/1126* (2013.01)

(58) Field of Classification Search
CPC H01L 29/808; H01L 31/1126; H01L 29/1066; H01L 29/66901; H01L 27/14679

USPC ....... 257/256–259, 270, 272, 285, 287, 462, 257/E29.312, E27.148; 438/186, 195
See application file for complete search history.

(56) References Cited

U.S. PATENT DOCUMENTS

| 4,686,555 A * | 8/1987 | Yusa ................. H01L 27/14679 257/113 |
| 5,089,862 A * | 2/1992 | Warner, Jr. ......... H01L 21/2033 257/192 |
| 2005/0093017 A1* | 5/2005 | Fujikawa ............ H01L 29/0634 257/162 |
| 2005/0173726 A1* | 8/2005 | Potts ................... H01L 29/0692 257/134 |

(Continued)

FOREIGN PATENT DOCUMENTS

| JP | 2006-196789 A | 7/2006 |
| JP | 2007-165736 A | 6/2007 |

*Primary Examiner* — Fernando L Toledo
*Assistant Examiner* — Aaron Gray
(74) *Attorney, Agent, or Firm* — Canon USA, Inc. IP Division

(57) ABSTRACT

One embodiment according to the present disclosure is an imaging apparatus including pixels. The pixel includes a junction type field effect transistor (JFET) provided in a semiconductor substrate. The JFET includes a gate region and a channel region. An orthogonal projection of the gate region onto a plane parallel to a surface of the semiconductor substrate intersects an orthogonal projection of the channel region onto the plane. Each of a source-side portion of the orthogonal projection of the channel region and a drain-side portion of the orthogonal projection of the channel region protrudes out of the orthogonal projection of the gate region.

8 Claims, 10 Drawing Sheets

(56) References Cited

U.S. PATENT DOCUMENTS

2008/0093635 A1* 4/2008 Kobayashi .......... H01L 29/1066
257/256
2008/0272414 A1* 11/2008 Vora .................. H01L 27/14603
257/291

* cited by examiner

CHANNEL WIDTH DIRECTION

CHANNEL WIDTH DIRECTION

IMAGING APPARATUS, IMAGING SYSTEM AND MANUFACTURING METHOD OF IMAGING APPARATUS

BACKGROUND OF THE INVENTION

Field of the Invention

The present disclosure relates to imaging apparatus, imaging systems and manufacturing methods of imaging apparatus.

Description of the Related Art

An imaging apparatus which utilizes Junction type Field Effect Transistors has been proposed. Japanese Patent Laid-Open No. 2007-165736 describes an imaging apparatus including a plurality of pixels. Each pixel includes a Junction type Field Effect Transistor. In the Junction type Field Effect Transistor described in Japanese Patent Laid-Open No. 2007-165736, a channel region is sandwiched between a surface gate region and a buried gate region. The channel region is connected to a drain region at the end portion of the buried gate region.

Also, Japanese Patent Laid-Open No. 2006-196789 discloses a method of manufacturing a Junction type Field Effect Transistor. According to the method described in Japanese Patent Laid-Open No. 2006-196789, a surface region, a channel region, and source and drain regions of the Junction type Field Effect Transistor are formed by ion implantations using, as masks, different resist patterns from each other.

SUMMARY OF THE INVENTION

According to an aspect of the present disclosure, a manufacturing method of an imaging apparatus is provided. The imaging apparatus includes pixels. Each pixel includes a junction type field effect transistor provided in a semiconductor substrate. The manufacturing method includes a step of forming a gate region of the junction type field effect transistor. The gate region is formed by doping the semiconductor substrate with an impurity using a first mask which defines a first opening. The manufacturing method includes a step of forming a channel region of the junction type field effect transistor. The channel region is formed by doping the semiconductor substrate with an impurity using a second mask which defines a second opening. The second opening includes a first portion and a second portion. The first portion corresponds to a source-side portion of the channel region. The second portion corresponds to a drain-side portion of the channel region. An orthogonal projection of the first opening onto a plane parallel to a surface of the semiconductor substrate intersects an orthogonal projection of the second opening onto the plane. Each of an orthogonal projection of the first portion onto the plane and an orthogonal projection of the second portion onto the plane overlaps with an orthogonal projection of the first mask onto the plain.

According to an aspect of the present disclosure, a manufacturing method of an imaging apparatus is provided. The imaging apparatus includes pixels. Each pixel including a junction type field effect transistor provided in a semiconductor substrate. The manufacturing method includes a step of forming a gate region of the junction type field effect transistor in the semiconductor substrate. The manufacturing method includes a step of forming a channel region of the junction type field effect transistor in the semiconductor substrate. A first region is defined as a region into which an impurity is doped during the step of forming the gate region.

A second region is defined as a region into which an impurity is doped during the step of forming the channel region. An orthogonal projection of the first region onto a plane parallel to a surface of the semiconductor substrate intersects an orthogonal projection of the second region onto the plane. Each of a source-side portion of the orthogonal projection of the second region and a drain-side portion of the orthogonal projection of the second region protrudes out of the orthogonal projection of the first region.

According to another aspect of the present disclosure, an imaging apparatus is provided. The imaging apparatus includes pixels. Each pixel includes a junction type field effect transistor provided in a semiconductor substrate. The junction type field effect transistor includes a gate region and a channel region. An orthogonal projection of the gate region onto a plane parallel to a surface of the semiconductor substrate intersects an orthogonal projection of the channel region onto the plane. Each of a source-side portion of the orthogonal projection of the channel region and a drain-side portion of the orthogonal projection of the channel region protrudes out of the orthogonal projection of the gate region.

According to another aspect of the present disclosure, an imaging apparatus is provided. The imaging apparatus includes pixels. Each pixel includes a junction type field effect transistor provided in a semiconductor substrate. The junction type field effect transistor includes a surface gate region, a buried gate region and a channel region. The surface gate region, the buried gate region and the channel region are arranged, located, positioned, or disposed at different depths from each other. The channel region is arranged, located, positioned, or disposed between the surface gate region and the buried gate region. Each of an orthogonal projection of the surface gate region onto a plane parallel to a surface of the semiconductor substrate and an orthogonal projection of the buried gate region onto the plane intersects an orthogonal projection of the channel region onto the plane.

According to another aspect of the present disclosure, an imaging system is provided. An imaging system includes the imaging apparatus described above and a signal processing unit configured to process a signal output from the imaging apparatus.

Further features of the present disclosure will become apparent from the following description of exemplary embodiments with reference to the attached drawings.

DESCRIPTION OF THE EMBODIMENTS

Figure 1:
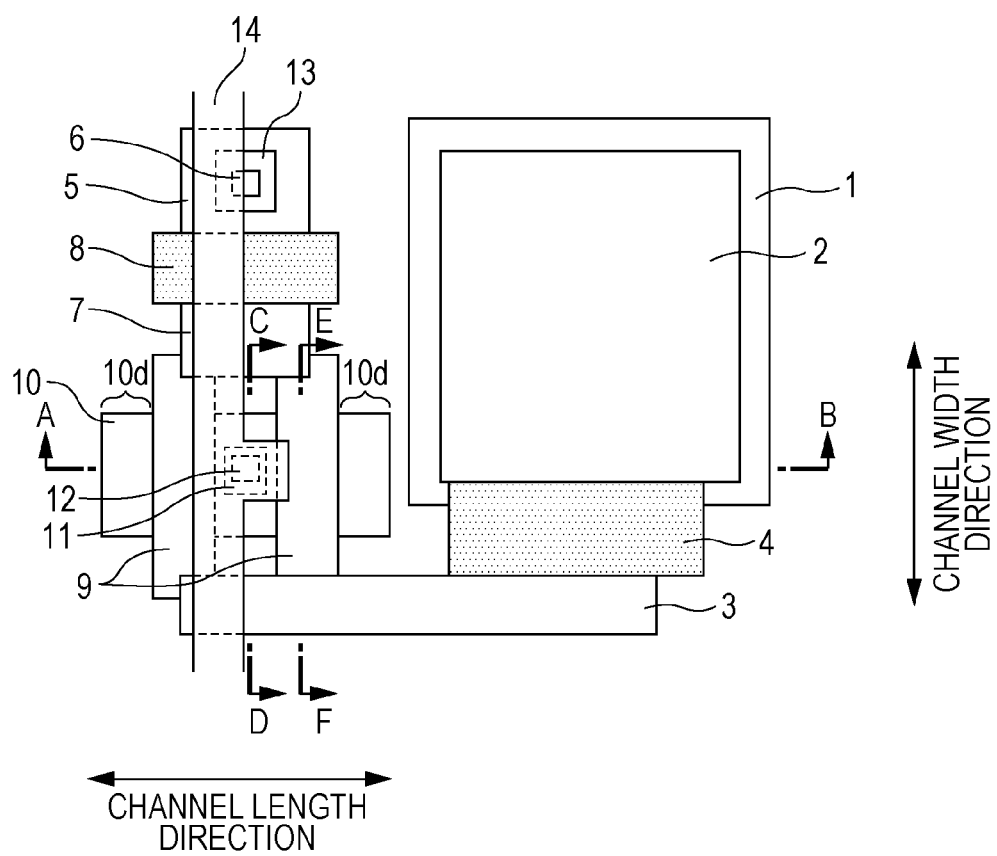
FIG. 1 is a diagram schematically illustrating a planar structure of an imaging apparatus.

According to some embodiments of the present disclosure, fluctuations in a characteristic of a Junction type Field Effect transistor may be reduced.

In a Junction type Field Effect transistor known to the inventor, a drain-side end of a channel region is defined by the position of an end of a buried gate region. On the other hand, a source-side end of the channel region is defined by the position of a source region. Accordingly, if there is an alignment error between a mask used to form the source region and a mask used to form the buried gate region, the channel length may be changed, which may lead to fluctuations in a characteristic of the Junction type Field Effect transistor.

In a manufacturing method known to the inventor, if there is an alignment error between a mask used to form a surface gate region and a mask used to form a channel region, the channel width may be changed, which may lead to fluctuations in a characteristic of the Junction type Field Effect transistor.

Some embodiments of the present disclosure provide an imaging apparatus including a Junction type Field Effect Transistor where fluctuations in a characteristic thereof may be reduced.

An embodiment of the present disclosure provides an imaging apparatus including a plurality of pixels. Each pixel includes a Junction type Field Effect Transistor (hereinafter, referred to as JFET). The JFET includes a gate region, a channel region, a drain region and a source region, respectively formed in a semiconductor substrate. In the JFET, a conductivity type of the gate region is different from conductivity types of the channel region, the drain region and the source region. In the present embodiment, the imaging apparatus utilizes a lateral JFET where a direction of channel current is parallel to the surface of the semiconductor substrate.

Embodiments according to the present disclosure are featured in the structure of the gate region and the channel region and/or in the manufacturing method thereof. Specifically, the gate region and the channel region are formed so as to intersect each other when viewed in a planar view. In the present specification, when it refers to arrangements, positions or shapes of members when viewed in a planar view, or just in a planar view, it means arrangements, positions or shapes of orthogonal projections of the members which are vertically projected onto a plane parallel to the surface of the semiconductor substrate. Thus, an orthogonal projection of the gate region onto a plane parallel to the surface of the semiconductor substrate and an orthogonal projection of the channel region onto the plane parallel to the surface of the semiconductor substrate intersect each other on the plane. The surface of the semiconductor substrate is defined as an interface between a semiconductor region and an insulator. The projection may be a shadow of an object which is produced on a plane when the object is exposed to parallel rays which are vertical to the plane.

Intersecting of two region means that each region is arranged, located, positioned, or disposed to cross over the other region. In other words, intersecting of two regions means that at least two parts of one region protrude out of the other region and that at least two parts of the other region protrude out of the one region. If one of two regions contains completely the other region, the two regions don't intersect each other.

In the manufacturing method of embodiments according to the present disclosure, a plurality of masks are used to form the gate region and the channel region. The masks respectively include openings that intersect each other when viewed in a planar view.

According to the above described configuration, even though there could be alignment errors between the mask used to form the gate region and the mask used to form the channel region, a shape of an intersectional part between the gate region and the channel region is almost steady, or constant, or unchanged. Thus, fluctuations in the channel length and the channel width of the JFET may be reduced. As a result, fluctuations in the characteristic of the JFET may be reduced.

Hereinafter, embodiments of the present disclosure will be described in detail with reference to the appended drawing. The present disclosure is not restricted to embodiments alone that will be described below. Also, examples in which a partial configuration of one of the following embodiments is added to another embodiment or replaced with a partial configuration of another embodiment are also embodiments of the present disclosure.

In embodiments to be described, the gate region is of P-type, and the channel region, the drain region and the source region are of N-type. The present disclosure includes embodiments where the conductivity type of each semiconductor region is reversed.

First Embodiment

FIG. 1 is a diagram schematically illustrating a planar structure of an imaging apparatus of the present embodiment. FIG. 1 illustrates one pixel. The pixel includes a photoelectric conversion portion such as a photodiode, a transfer transistor, a reset transistor and a JFET. The imaging apparatus of the present embodiment includes a plurality of the pixel illustrated in FIG. 1.

In the present embodiment, the photoelectric conversion portion is a photodiode. The photodiode includes an N-type semiconductor region 1 formed in the surface of the semiconductor substrate and a P-type semiconductor region 2 formed under the N-type semiconductor region 1. The N-type semiconductor region 1 and the P-type semiconductor region 2 form a P-N junction. A hole generated by incident light is accumulated in the P-type semiconductor region 2 as a signal charge. The signal charge accumulated in the P-type semiconductor region 2 is transferred to a floating diffusion region 3 (hereinafter, referred to as FD region 3). The FD region 3 is a P-type semiconductor region. A transfer gate electrode 4 transfers the signal charge from the P-type semiconductor region 2 to the FD region 3.

The JFET includes a P-type gate region 9, an N-type channel region 10 and an N-type source region 11. A channel is formed at least in a part of the N-type channel region 10. The channel is controlled by a voltage of the gate region 9. The JFET of the present embodiment includes a plurality of the gate regions 9. The channel region 10 intersects each of the gate regions 9 when viewed in a planar view. The channel region 10 is arranged, located, positioned, or disposed to cross the gate region 9 from the source side to the drain side. A part of the channel region 10 (indicated as region 10d in FIG. 1) forms a drain region of the JFET. The channel of the JFET is formed in an intersectional part between the gate region 9 and the channel region 10. An impurity density of the source region 11 is higher than an impurity density of the channel region 10. The source region 11 is electrically connected to an output line 14 via a contact plug 12. The FD region 3 is electrically connected to the gate region 9. In the above described configuration, the JFET outputs a signal based on the voltage of the FD region 3.

The reset MOS (metal oxide semiconductor) transistor includes a P-type drain region 5, a P-type source region 7 and a gate electrode 8. The drain region 5 is electrically connected to a reset drain wiring 13 via a contact plug 6. The source region 7 of the reset MOS transistor is electrically connected to the gate region 9 of the JFET. In the above described configuration, the reset MOS transistor resets the voltage of a gate of the JFET. It may be simple to use an MOS transistor for the reset transistor. Other type of transistors including JFET may be used for the reset transistor.

The JFET of the present embodiment includes a plurality of the gate regions 9 which spread out when viewed in a planar view. The gate regions 9 are arranged, located, positioned, or disposed to sandwich the source region 11 in the planar view. In other words, an orthogonal projection of the source region 11 onto a plane parallel to the surface of the semiconductor substrate is located, in the plane, between orthogonal projections of the gate regions 9 onto the plane. Further, the JFET of the present embodiment includes a plurality of the drain regions. More precisely, the channel region 10 includes a plurality of drain-side portions 10d. Each of the drain regions is arranged, located, positioned, or disposed on opposite side to the source region 10 with respect to corresponding one of the gate regions 9. The channel is formed for each of the gate regions 9. The gate regions 9 may be arranged, located, positioned, or disposed in parallel to each other when view in a planar view. The gate regions 9 are electrically connected to each other by a semiconductor region having the same conductivity type as the gate regions 9. In the present embodiment, the FD region 3 and the source region 7 of the reset MOS transistor electrically connect the gate regions 9 to each other.

According to the above described configuration, the effective channel width of the JFET may be widened. That is to say, the drive capability of the JFET may be improved. Thus, the imaging apparatus may operate at a high speed. The JFET may include only a single gate region. Specifically, one of the two gate regions 9 illustrated in FIG. 1 and a corresponding drain region may be removed.

Figure 2:
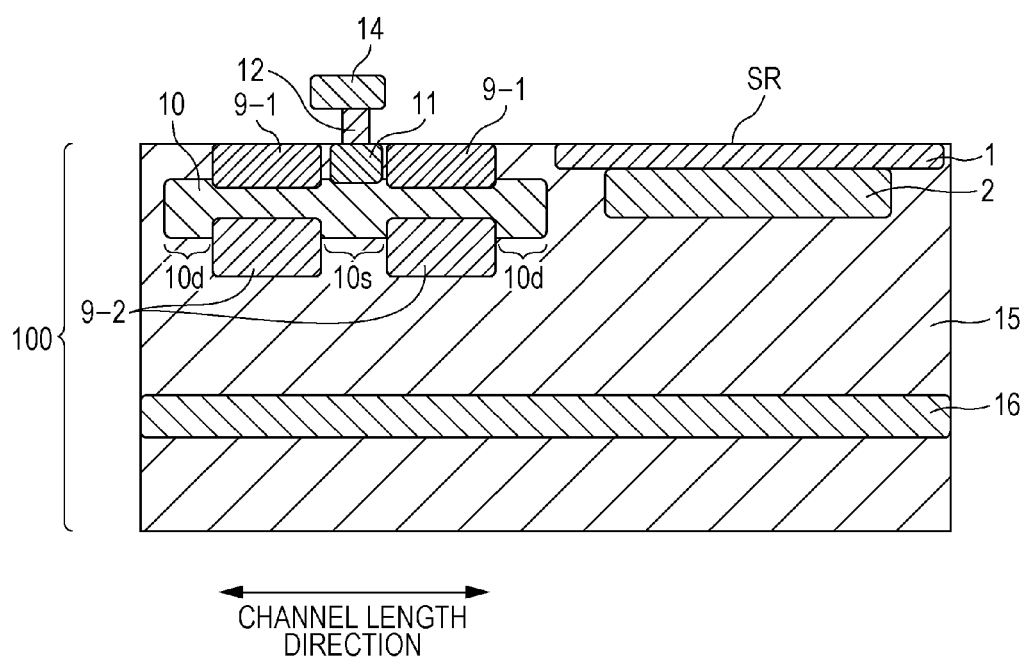
FIG. 2 is a diagram schematically illustrating a cross sectional structure of an imaging apparatus.

FIG. 2 is a diagram schematically illustrating a cross sectional structure of the imaging apparatus of the present embodiment. FIG. 2 schematically illustrates the cross sectional structure along a line A-B in FIG. 1. Elements of FIG. 2 corresponding to those illustrated in FIG. 1 are designated by the same reference numerals as FIG. 1.

FIG. 2 illustrates a semiconductor substrate 100. An insulator film which is not illustrated is provided on the semiconductor substrate 100. The surface SR of the semiconductor substrate 100 is defined as an interface between the semiconductor substrate 100 and the insulator film which is not illustrated. A channel length direction is defined as a direction which is parallel both to a paper plane of FIG. 2 and to the surface SR.

The photodiode and the JFET are formed in an N-type semiconductor region 15. A drain current (or, channel current) of the JFET is provided by the N-type semiconductor region 15. A drain current providing portion configured to provide the drain current for the N-type semiconductor region 15 is formed in a part of a pixel area or outside the pixel area. The drain current providing portion, for example, includes a contact plug connecting the semiconductor substrate and a wiring.

Under the N-type semiconductor region 15, provided is an N-type semiconductor region 16 which has a higher impurity density than that of the N-type semiconductor region 15. The resistance of the semiconductor substrate 100 may be lowered by the N-type semiconductor region 16. Accordingly, it is possible to reduce a voltage drop due to the drain current provided for the JFET. Thus, it is possible to reduce noises such as shading which occurs because the voltage of the semiconductor substrate varies depending on locations. As a result, image quality may be improved. Otherwise, the drain current may be increased. As a result, the imaging apparatus may operate at a high speed.

The drain-side portion 10d of the channel region 10 may be omitted and a part of the N-type semiconductor region 15 may form the drain region. The drain region may be defined as an N-type semiconductor region which is arranged, located, positioned, or disposed, in a planar view, adjacently to a region where the channel is to be formed.

The gate region 9 includes a surface gate region 9-1 and a buried gate region 9-2. Both of the surface gate region 9-1 and the buried gate region 9-2 are of P-type. The surface gate region 9-1 and the buried gate region 9-2 are arranged, located, positioned, or disposed at different depths from each other. The channel region 10 is arranged, located, positioned, or disposed at a depth between the surface gate region 9-1 and the buried gate region 9-2. A lateral JFET is formed in the above described configuration. In the lateral JFET, the channel length direction is parallel to the surface SR of the semiconductor substrate 100.

The surface gate region 9-1 and the buried gate region 9-2 are electrically connected to each other. A connection portion between the surface gate region 9-1 and the buried gate region 9-2 is arranged, located, positioned, or disposed not to overlap with the channel region 10 when viewed in a planar view. According to the above described configuration, the channel of the JFET may be controlled both by the surface gate region 9-1 and by the buried gate region 9-2.

The surface gate region 9-1 and the buried gate region 9-2 overlap with each other when viewed in a planar view. In other words, an orthogonal projection of the surface gate region 9-1 onto a plane parallel to the surface of the semiconductor substrate is identical to an orthogonal projection of the buried gate region 9-2 onto the plane. In the above described configuration, the surface gate region 9-1 and the buried gate region 9-2 may be formed with the same mask, which is advantageous for reducing fluctuations in a characteristic of the JFET.

The orthogonal projection of the surface gate region 9-1 is not necessary to be identical to the orthogonal projection of the buried gate region 9-2. For example, the surface gate region 9-1, the buried gate region 9-2 and the channel region 10 may be arranged, located, positioned, or disposed such that the surface gate region 9-1 intersects the channel region 10 in a planar view while the buried gate region 9-2 contains completely the channel region 10 in the planar view. In the above described configuration, the surface gate region 9-1 and the buried gate region are formed with different masks.

Either the surface gate region 9-1 or the buried gate region 9-2 may be omitted. In the present embodiment, each of the gate regions 9, which spread out when viewed in a planar view, includes the surface gate region 9-1 and the buried gate region 9-2. However, at least one of the gate regions 9 which spread out in the planar view may have the surface gate region 9-1 or the buried gate region 9-2.

Figure 3A:
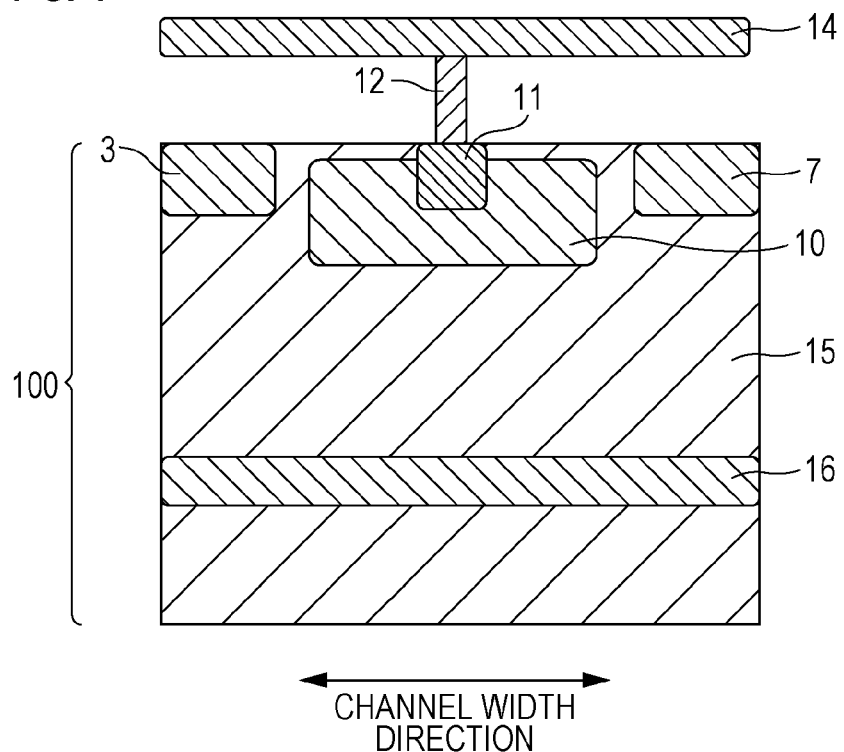
FIG. 3A is a diagram schematically illustrating a cross sectional structure of an imaging apparatus.

FIG. 3A is a diagram schematically illustrating a cross sectional structure of the imaging apparatus of the present embodiment. FIG. 3 schematically illustrates the cross sectional structure along a line C-D in FIG. 1. Elements of FIG. 3A corresponding to those illustrated in FIG. 1 and/or in FIG. 2 are designated by the same reference numerals as FIG. 1 and/or as FIG. 2. A channel width direction is defined as a direction which is parallel both to a paper plane of FIG. 3A and to the surface SR.

As illustrated in FIG. 3A, with respect to a region directly under the source region 11, no P-type semiconductor regions are provided between the channel region 10 and the N-type semiconductor region 15. However, the channel region 10 and the N-type semiconductor region 15 are electrically isolated from each other. Specifically, a depletion region provided by a P-N junction between the two buried gate region 9-2 and the N-type semiconductor region 15 shown in FIG. 2 forms a potential barrier between the channel region 10 and the N-type semiconductor region. The depletion region, or the potential barrier, prevents ohmic conduction between the channel region 10 and the N-type semiconductor region 15. Actually, potential profiles may be designed such that electrical resistance, along a vertical direction to the surface SR, between the channel region 10 and the N-type semiconductor region 15 may be higher than electrical resistance, along the channel length direction, between the source and the drain of the JFET.

Figure 3B:
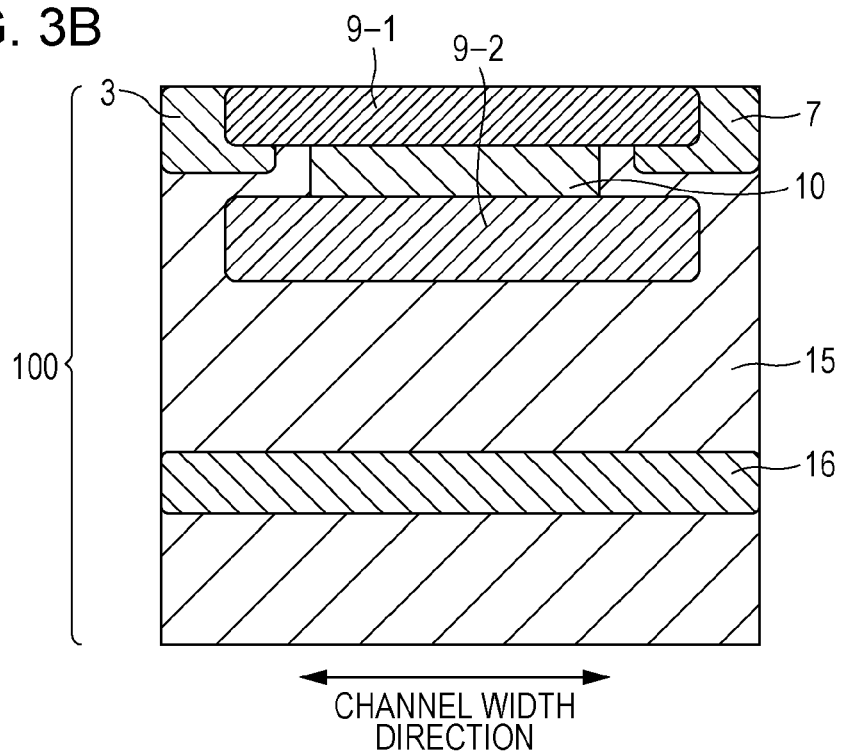
FIG. 3B is a diagram schematically illustrating a cross sectional structure of an imaging apparatus.

FIG. 3B is a diagram schematically illustrating a cross sectional structure of the imaging apparatus of the present embodiment. FIG. 3B schematically illustrates the cross sectional structure along a line E-F in FIG. 1. Elements of FIG. 3B corresponding to those illustrated in any of FIGS. 1 through 3A are designated by the same reference numerals as FIG. 1 through 3A. A channel width direction is defined as a direction which is parallel both to a paper plane of FIG. 3B and to the surface SR.

As mentioned above, the surface gate region 9-1 and the buried gate region 9-2 are electrically connected to each other. In the present embodiment, the region having the same conductivity type electrically connects the surface gate region 9-1 and the buried gate region 9-2. For example, in FIG. 3B, the FD region 3 and the source region 7 of the reset MOS transistor may extend toward deep into the semiconductor substrate to the extent that they may electrically connect the surface gate region 9-1 and the buried gate region 9-2. Although, in FIG. 3, the surface gate region 9-1 and the buried gate region 9-2 are arranged, located, positioned, or disposed with a distance therebetween, the surface gate region 9-1 and the buried gate region 9-2 may be formed, as another variation, in spatially continuously by an impurity diffusion along a vertical direction to the surface SR.

In the present embodiment, the gate region 9 and the channel region 10 intersect each other in the planar structure illustrated in FIG. 1. In other words, the orthogonal projection of the gate region 9 onto the plane parallel to the surface of the semiconductor substrate and the orthogonal projection of the channel region 10 onto the plane parallel to the surface of the semiconductor substrate intersect each other.

Intersecting of the gate region 9 and the channel region 10 means that each region is arranged, located, positioned, or disposed to cross over the other region. In other words, at least two parts of the gate region 9 protrude out of the channel region 10 and at least two parts of the channel region 10 protrude out of the gate region 9.

A part of the channel region which is arranged, located, positioned, or disposed between the two gate regions 9 when viewed in a planar view of FIG. 1 is defined as a source-side portion 10s of the channel region 10. A part, within the channel region 10, arranged, located, positioned, or disposed on opposite side to the source-side region 10s with respect to the gate region 9 is defined as the drain-side portion 10d of the channel region 10. FIG. 2 also indicates the source-side portion 10s and the drain-side portion 10d, respectively. Each of the source-side portion 10s and the drain-side portion 10d of the channel region 10 does not overlap with the gate region 9. In other words, the source-side portion 10s and the drain-side portion 10d of the orthogonal projection of the channel region 10 respectively protrude out of the orthogonal projection of the gate region 9. Accordingly, as illustrated in FIG. 2, the channel length of the JFET is defined by the end of the gate region 9. As illustrated in FIG. 3B, the channel width of the JFET is defined by the end of the channel region 10.

According to the above described configuration, even though there could be alignment errors between a mask used to form the gate region 9 and a mask used to form the channel region 10, a shape of the channel of the JFET is almost steady, or constant, or unchanged. Thus, fluctuations in the channel length and the channel width of the JFET may be reduced. As a result, fluctuations in the characteristic of the JFET may be reduced.

In FIG. 2, electrons from the source region 11 of the JFET run, along the channel length direction, through the channel formed between the surface gate region 9-1 and the buried gate region 9-2, and then, flow into the N-type semiconductor region 15, which generates the channel current. The amplitude of the channel current is basically controlled by the voltage of the source region 11, the voltage of the gate region 9, the voltage of the N-type semiconductor region 15 (which is the drain region), the channel length and the channel width.

In the present embodiment, the channel length and the channel width are defined by the two rectangles defined as the intersectional portions between the gate region 9 and the channel region 10 in FIG. 1. The channel length is defined as a length of a side along the channel length direction of the rectangle. Since the channel current runs toward both directions, the channel width is defined as a length twice as a length of a side along the channel width direction of the rectangle.

In the present embodiment, the gate regions 9 have rectangular shapes which are in parallel to each other, and the channel region 10 has a rectangular shape. The gate region 9 and the channel region 10 overlap with each other as being oversize to each other in a specific direction. The gate region 9 is oversize to the channel region 10 in the channel width direction of FIG. 1. The channel region 10 is oversize to the gate region 9 in the channel length direction of FIG. 1. Accordingly, even though there could be alignment errors between a mask used to form the gate region 9 and a mask used to form the channel region 10, the shape of the rectangle of the intersectional part is almost steady, or constant, or unchanged. Therefore, fluctuations in the electrical characteristic of the JFET, due to the alignment error which may occur in the process to form the JFET, may be reduced.

The reduction of the fluctuation in the electrical characteristic of the JFET may be achieved regardless of the shape of the gate region 9 or the shape of the channel region 10. The reduction of the fluctuation may be obtained because of the structure where the gate region 9 and the channel region intersect each other when viewed in a planar view. A periphery, in a planar view, of the gate region 9 may include two parallel lines along the channel width direction, as illustrated in FIG. 1. In this configuration, the fluctuation in the electrical characteristic may be more reduced. A periphery, in a planar view, of the channel region 10 may include two parallel lines along the channel length direction, as illustrated in FIG. 1. In this configuration, the fluctuation in the electrical characteristic may be more reduced. The gate region 9 and/or the channel region 10 may have rectangular shapes, respectively, so that masks used to form the gate region 9 and the channel region may be simplified. The peripheries of the gate region 9 and the channel region 10 may include curves. In this configuration, fluctuations in the electrical characteristic of the JFET, due to a rotational alignment error, may be reduced.

The channel length of the JFET is defined as a distance between the drain-side end and the source-side end of the gate region 9. The drain-side portion 10$d$ and the source-side portion 10$s$ of the channel region 10 are divided into both sides of the gate region 9 when viewed in a planar view, which leads to the reduction of the fluctuation in the characteristics. In other words, the reduction of the fluctuation in the characteristics may be obtained by that each of the source-side portion 10$s$ and the drain-side portion 10$d$ of the orthogonal projection of the channel region 10 protrudes out of the orthogonal projection of the gate region 9.

Figure 4A:
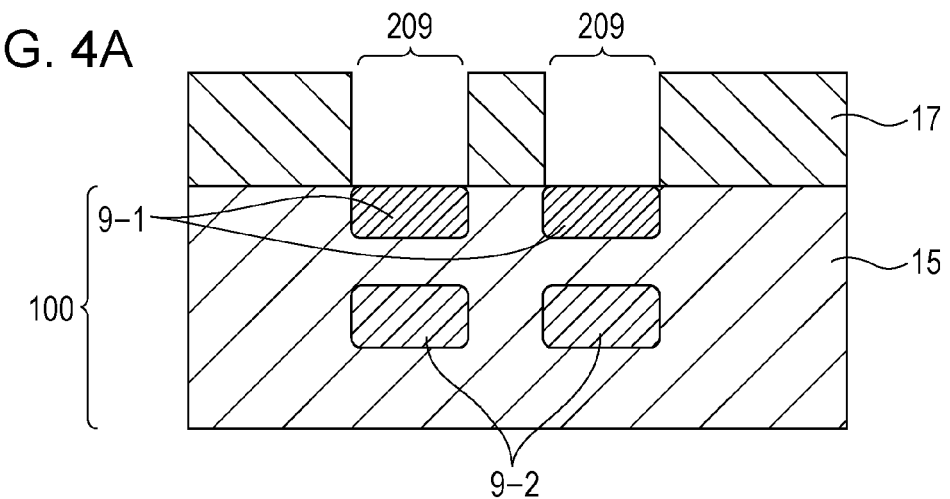
FIGS. 4A-4C are diagrams to explain a manufacturing method of an imaging apparatus.
Figure 4B:
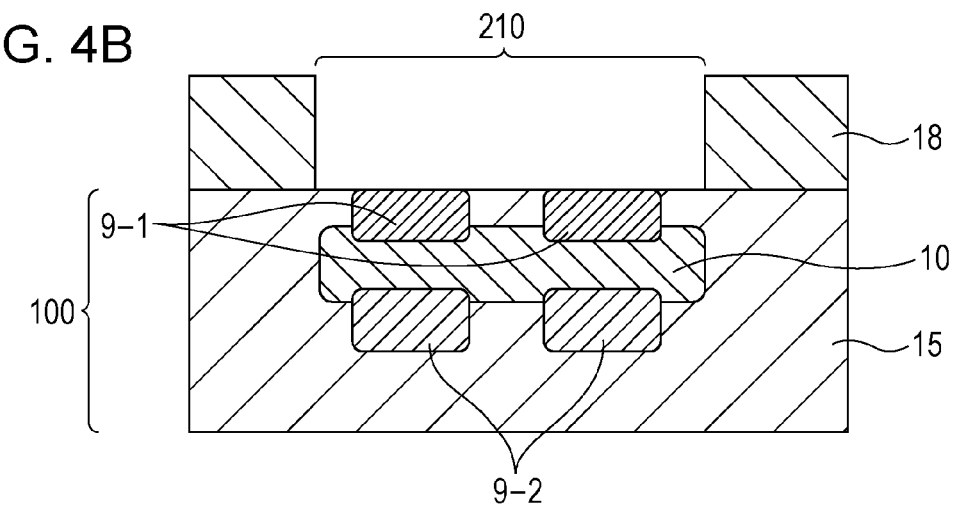
Figure 4C:
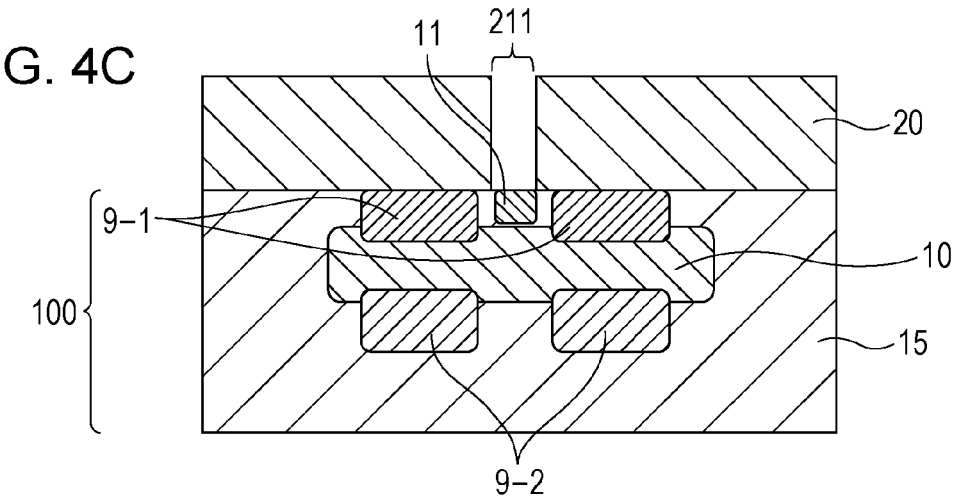

Hereinafter, an example of a manufacturing method of the imaging apparatus of the present embodiment will be explained. FIGS. 4A-4C are diagrams used to explain the manufacturing method of the imaging apparatus of the present embodiment. Each of FIGS. 4A-4C schematically illustrates a cross sectional structure along a line A-B in FIG. 1. Elements of FIGS. 4A-4C corresponding to those illustrated in any of FIGS. 1 through 3B are designated by the same reference numerals as FIGS. 1 through 3B.

In a step illustrated in FIG. 4A, the gate region 9 of the JFET is formed. In this step, a first mask 17 which defines a first opening 209 is used. The first mask 17 is, for example, obtained by patterning a photoresist by photolithography method.

Impurities to be acceptors, such as boron, are doped into the semiconductor substrate 100 through the first opening 209, whereby the gate region 9 is formed in a region corresponding to the first opening 209. For example, the gate region 9 may be formed by an ion implantation using the first mask 17. By performing a plurality of ion implantations at different implantation energies, the surface gate region 9-1 and the buried gate region 9-2 may be formed at different depths from each other. Generally, a higher energy is used to form a semiconductor region at a deeper position in the semiconductor substrate 100. According to the implantation energies, the surface gate region 9-1 and the buried gate region 9-2 may be formed in spatially continuously by an impurity diffusion along a vertical direction to the surface SR. After forming the gate region 9, the first mask 17 is removed.

Besides the ion implantation, a thermal diffusion method may be used to dope the semiconductor substrate 100 with the impurity.

In a step illustrated in FIG. 4B, the channel region 10 of the JFET is formed. In this step, a second mask 18 which defines a second opening 210 is used. The second mask 18 is, for example, obtained by patterning a photoresist by photolithography method.

Impurities to be donors, such as phosphorus and arsenic, are doped into the semiconductor substrate 100 through the second opening 210, whereby the channel region 10 is formed in a region corresponding to the second opening 210. For example, the channel region 10 may be formed by an ion implantation using the second mask 18. The implantation energy used to form the channel region 10 may be adjusted so that the channel region 10 is formed at a depth between the surface gate region 9-1 and the buried gate region 9-2. After forming the channel region 10, the second mask 18 is removed.

Although it is not shown in FIG. 4, a P-type semiconductor region that electrically connects the plurality of the gate regions 9 to each other may be formed using a third mask 19 which defines third openings 203 and 207. The third mask 19 is, for example, obtained by patterning a photoresist by photolithography method.

In the present embodiment, the FD region 3 and the source region 7 of the reset MOS transistor are formed using the third mask 19. These regions electrically connect the gate regions 9 to each other. After forming the P-type semiconductor region that electrically connects the plurality of the gate regions 9 to each other, the third mask 19 is removed.

In a step illustrated in FIG. 4C, the source region 11 which is connected to the source-side portion 10$s$ of the channel region 10 is formed. In this step, a mask 20 which defines an opening 211 is used. The mask 20 is a hard mask. The mask 20 includes an insulator film made of an inorganic material such as silicon oxide, silicon nitride, and silicon oxy-nitride.

Impurities to be donors, such as phosphorus and arsenic, are doped into the semiconductor substrate 100 through the opening 211, whereby the source region 11 is formed in a region corresponding to the opening 211.

The mask 20 may be used as an interlayer insulation film, when the hard mask is used as the mask 20 as mentioned above. Specifically, after forming the source region 11, the mask 20 remains not to be removed, and then, the contact plug 12 electrically connected to the source region 11 is formed in the opening 211. Thereafter, the output line 14 connected to the contact plug 12 is formed on the mask 20.

Figure 5A:
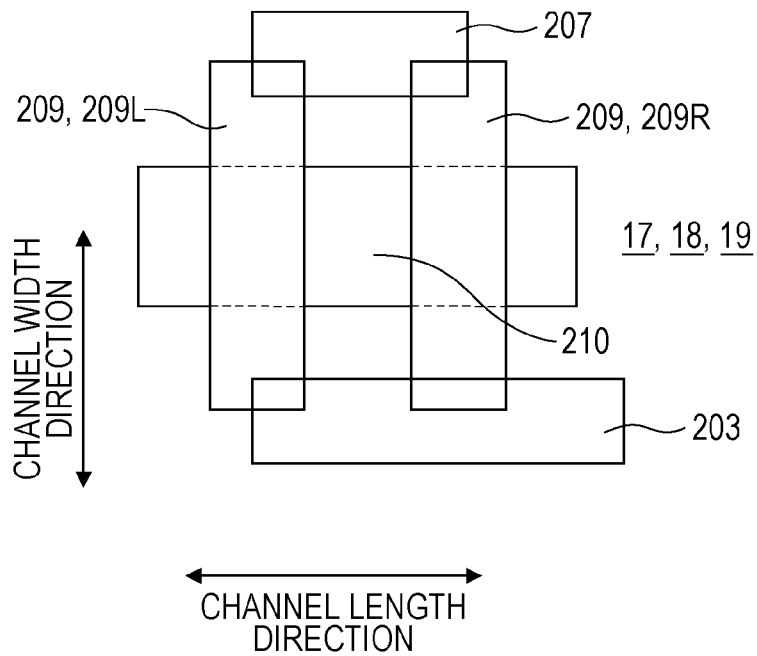
FIGS. 5A-5B are diagrams schematically illustrating masks used in manufacturing of an image apparatus.
Figure 5B:
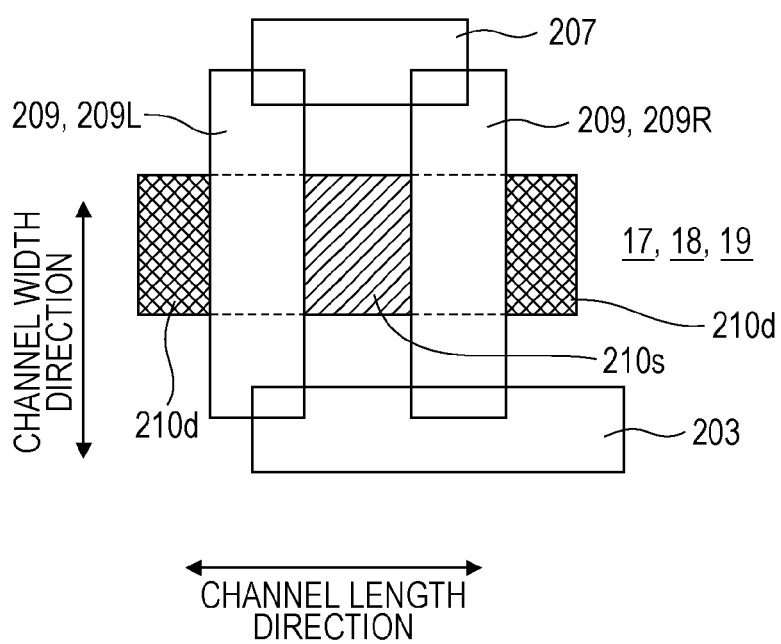

Next, planar structures of the first through third masks 17-19 and relative positions thereof will be explained. FIGS. 5A and 5B are diagrams schematically illustrating the first through third masks 17-19 used in the steps illustrated in FIGS. 4A-4C. Elements of FIGS. 5A-5B corresponding to those illustrated in any of FIGS. 4A through 4C are designated by the same reference numerals as FIGS. 4A through 4C.

Each of FIGS. 5A and 5B illustrates the first opening 209, the second opening 210 and the third openings 203 and 207. FIG. 5B distinguishes each part of the second opening 210. In the present embodiment, each of the first opening 209, the second opening 210 and the third openings 203 and 207 has a rectangular shape. The first mask 17 which defines the first opening 209 is indicated as an area outside a rectangle indicating the opening 209. The second mask 18 which defines the second opening 210 is indicated as an area outside a rectangle indicating the second opening 210. The third mask 19 which defines the third openings 203 and 207 is indicated as an area outside a rectangle indicating the third openings 203 and 207.

For ease of explanation, the first through third openings 209, 210, 203 and 207 are illustrated to overlap with each other in FIGS. 5A and 5B, whereby indicates alignments between the masks. However, the mask may be removed after forming the corresponding semiconductor region in each step. Accordingly, two or more masks are not necessarily provided at the same time.

The first opening 209 and the second opening 210 intersect each other when viewed in a planar view. In other words, an orthogonal projection of the first opening 209 onto a plane parallel to the surface of the semiconductor substrate 100 intersect an orthogonal projection of the second opening 210 onto the plane.

As illustrated in FIG. 5B, the second opening 210 includes a source-side portion 210s and a drain-side portion 210d. The source-side portion 210s of the second opening 210 corresponds to the source-side portion 10s of the channel region 10. The drain-side portion 210d of the opening 210 corresponds to the drain-side portion 10d of the channel region 10. In FIG. 5B, there are two drain-side portions 210d: one is a part on left side of the first opening 209L, the other is a part on right side of the first opening 209R.

Each of the source-side portion 210s and the drain-side portion 210d of the second opening 210 overlaps with the first mask 17 when viewed in a planar view. In other words, each of an orthogonal projection of the source-side portion 210s onto a plane parallel to the surface of the semiconductor substrate 100 and an orthogonal projection of the drain-side portion 210d onto the plane overlaps with an orthogonal projection of the first mask 17 onto the plane. Accordingly, as illustrated in FIG. 5, the channel length of the JFET is defined by the ends of the first opening 209. The channel width of the JFET is defined by the ends of the second opening 210.

According to the above described configuration, even though there could be alignment errors between the first mask 17 used to form the gate region 9 and the second mask 18 used to form the channel region 10, a shape of the channel of the JFET is almost steady, or constant, or unchanged. Thus, fluctuations in the channel length and the channel width of the JFET may be reduced. As a result, fluctuations in the characteristic of the JFET may be reduced.

In the present embodiment, the first opening includes a plurality of openings 209L and 209R which are divided by the first mask 17. Each of the openings 209L and 209R intersects the second opening 210 when viewed in a planar view. In other words, each of orthogonal projections of the plurality of the opening 209L and 209R onto a plane parallel to the surface of the semiconductor substrate 100 intersects the orthogonal projection of the second opening 210. The source-side portion 210s of the second opening 210 overlaps with the first mask 17, specifically, with a part of the first mask 17 which is arranged, located, positioned, or disposed between the two openings 209L and 209R, when viewed in a planar view.

The first opening 209 partially overlap with the third openings 203 and 207 when viewed in a planar view. In other words, the orthogonal projection of the first opening 209 onto a plane parallel to the surface of the semiconductor substrate 100 partially overlaps with the orthogonal projections of the third openings 203 and 207 onto the plane.

According to the above described configuration, the effective channel width of the JFET may be widened. That is to say, the drive capability of the JFET may be improved. Thus, the imaging apparatus may operate at a high speed.

The entirety of the second opening 210 is overlapped with the third mask 19 when viewed in a planar view. In this configuration, it is possible to reduce amount of impurities doped into the channel region 10 when doping the semiconductor substrate 100 with impurities using the third mask 19. Accordingly, even though the P-type semiconductor region that electrically connects the gate regions 9 is formed, fluctuations in the electrical characteristic of the JFET may be reduced.

Figure 6A:
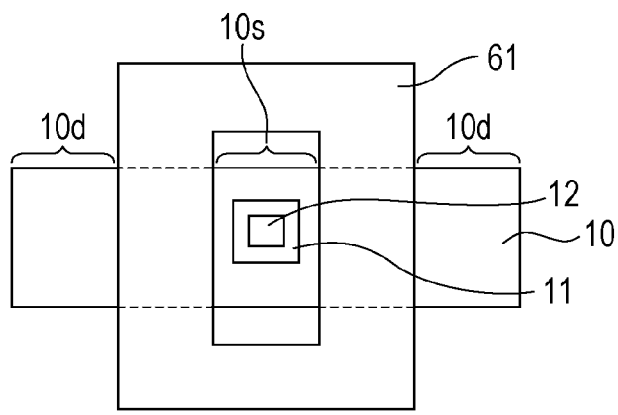
FIG. 6A is a diagram schematically illustrating a planar structure of an imaging apparatus.

Here, a variation of the present embodiment will be explained. FIG. 6A is a diagram schematically illustrating a planar structure of an imaging apparatus of the present embodiment. A JFET is illustrated in FIG. 6A. Elements of FIG. 6A corresponding to those illustrated in FIG. 1 are designated by the same reference numerals as FIG. 1. The structure of the imaging apparatus is similar to the first embodiment except for those explained otherwise.

One of the features of the present embodiment is a shape of a gate region 61 of the JFET. Specifically, the gate region 61 surrounds the source-side portion 10s of the channel region 10 when viewed in a planar view. Two parts of the gate region 61 respectively intersect the channel region 10 when viewed in a planar view. Each of the source-side region 10s and the drain-side region 10d of the channel region 10 does not overlap with the gate region 61. Each of the source-side region 10s and the drain-side region 10d protrudes out of the gate region 61. Accordingly, the channel length of the JFET is defined by the end of the gate region 61. The channel width of the JFET is defined by the end of the channel region 10.

According to the above described configuration, even though there could be alignment errors between a mask used to form the gate region 61 and a mask used to form the channel region 10, a shape of the channel of the JFET is almost steady, or constant, or unchanged. Thus, fluctuations in the channel length and the channel width of the JFET may be reduced. As a result, fluctuations in the characteristic of the JFET may be reduced.

In the variation illustrated in FIG. 6A, the gate region 61 is spatially continuous. The surface gate region and the buried gate region is electrically connected to each other via a connecting portion which does not overlap with the channel region 10 when viewed in a planar view. Thus, the effective channel width of the JFET may be widened while omitting the step to form the semiconductor region having the same conductivity type as the two gate regions and connecting the two gate regions. For example, a step to form the FD region 3 shown in FIG. 1 may be omitted.

Figure 6B:
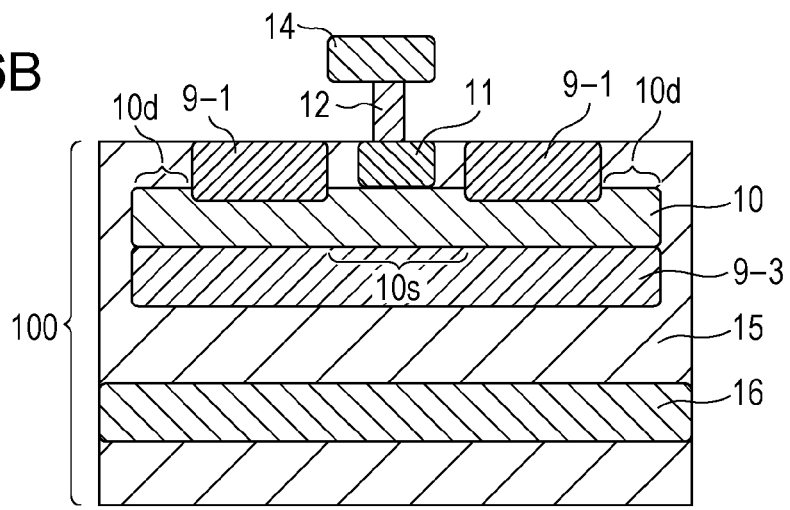
FIG. 6B is a diagram schematically illustrating a cross sectional structure of an imaging apparatus.

Here, another variation will be explained. FIG. 6B is a diagram schematically illustrating a cross sectional structure of an imaging apparatus of the present embodiment. A JFET is illustrated in FIG. 6B. Elements of FIG. 6B corresponding to those illustrated in FIG. 1 are designated by the same reference numerals as FIG. 1. The structure of the imaging apparatus is similar to the first embodiment except for those explained otherwise.

In the JFET illustrated in FIG. 6B, the gate region 9 includes a surface gate region 9-1 and a buried gate region 9-3. The buried gate region 9-3 includes a P-type semiconductor region having, in a planar view, a different shape from that of the surface gate region 9-1. The buried gate region 9-3 is electrically connected to the surface gate region 9-1. In FIG. 6B, the planar shape of the buried gate region 9-3 is identical to the planar shape of the channel region 10. Or, the buried gate region 9-3 may contain completely the channel region 10 when viewed in a planar view.

Figure 6C:
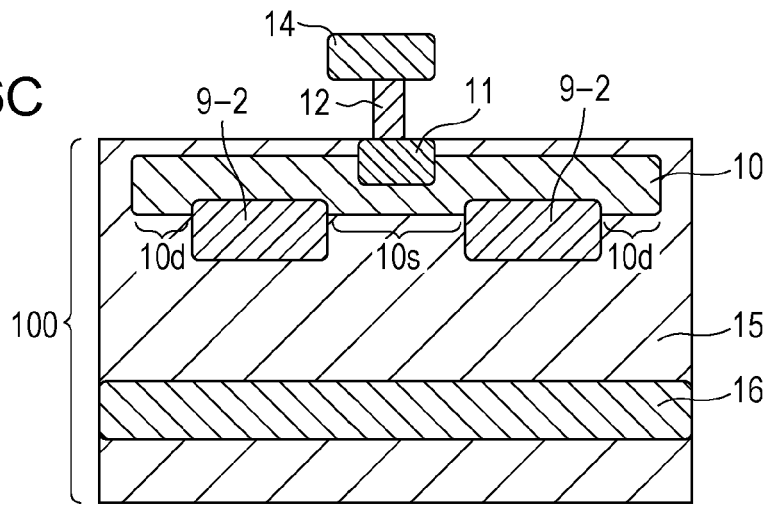
FIG. 6C is a diagram schematically illustrating a cross sectional structure of an imaging apparatus.

Here, another variation will be explained. FIG. 6C is a diagram schematically illustrating a cross sectional structure of an imaging apparatus of the present embodiment. A JFET is illustrated in FIG. 6C. Elements of FIG. 6C corresponding to those illustrated in FIG. 1 are designated by the same reference numerals as FIG. 1. The structure of the imaging apparatus is similar to the first embodiment except for those explained otherwise. The gate region 9 of the JFET illustrated in FIG. 6C only includes the buried gate region 9-2.

In these variations, the gate region 9 and the channel region 10 intersect each other. Accordingly, fluctuation of the electrical characteristic of the JFET may be reduced.

As described above, according to some of the embodiments, fluctuations of the characteristic of the JFET may be reduced.

Second Embodiment

Now, another embodiment will be described. Difference with the first embodiment is that a structure to reduce a parasitic JFET current is provided under the source region of the JFET. The explanation will focus on the differences with the first embodiment, and the explanation on the same structure as the first embodiment will be omitted.

Figure 7:
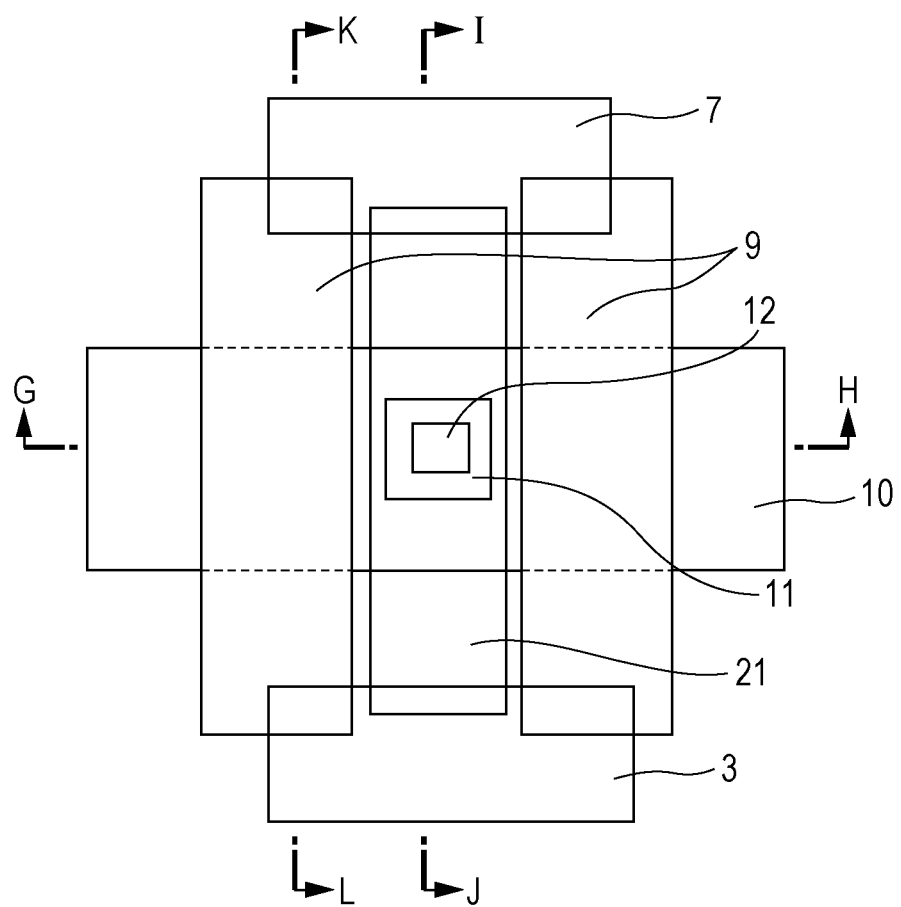
FIG. 7 is a diagram schematically illustrating a planar structure of an imaging apparatus.

FIG. 7 is a diagram schematically illustrating a planar structure of an imaging apparatus of the present embodiment. A JFET is illustrated in FIG. 7. Elements of FIG. 7 corresponding to those illustrated in FIG. 1 are designated by the same reference numerals as FIG. 1.

The pixel of the present embodiment includes a P-type semiconductor region 21. The semiconductor region 21 overlaps with the source region 11 when viewed in a planar view. In other words, an orthogonal projection of the P-type semiconductor region 21 onto a plane parallel to the surface of the semiconductor substrate overlaps with an orthogonal projection of the source region 11 onto the plane. The p-type semiconductor region 21 is arranged, located, positioned, or disposed between the two gate regions 9 when viewed in a planar view. In other words, the orthogonal projection of the P-type semiconductor region 21 onto the plane parallel to the surface of the semiconductor substrate is located between the orthogonal projections of the two gate regions 9 onto the plane.

Figure 8A:
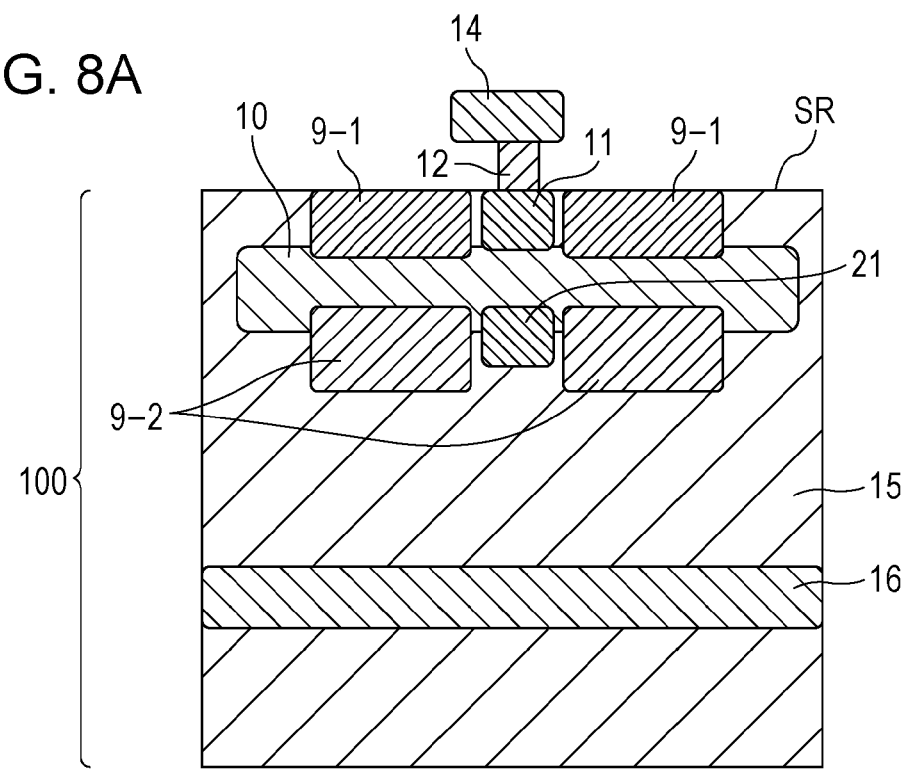
FIG. 8A is a diagram schematically illustrating a cross sectional structure of an imaging apparatus.

FIG. 8A is a diagram schematically illustrating a cross sectional structure of the imaging apparatus of the present embodiment. FIG. 8A schematically illustrates the cross sectional structure along a line G-H in FIG. 7. Elements of FIG. 8A corresponding to those illustrated in any of FIGS. 1 through 7 are designated by the same reference numerals as FIGS. 1 through 7.

As illustrated in FIG. 8A, the P-type semiconductor region 21 is arranged, located, positioned, or disposed at a deeper position than the channel region 10. When the P-type semiconductor region 21 and the channel region 10 are formed by ion implantations, a peak in an impurity density profile along a depth direction of the P-type semiconductor region 21 is located at a deeper position than a peek in an impurity density profile along the depth direction of the channel region 10. The depth direction is defined as a vertical direction to the surface SR.

In the present embodiment, the entirety of the P-type semiconductor region 21 is arranged, located, positioned, or disposed at the same depth as the buried gate region 9-2. In FIG. 8A, the P-type semiconductor region 21 and the buried gate region 9-2 are electrically connected to each other. The P-type semiconductor region 21 and the buried gate region 9-2 may be formed spatially continuously.

Figure 8B:
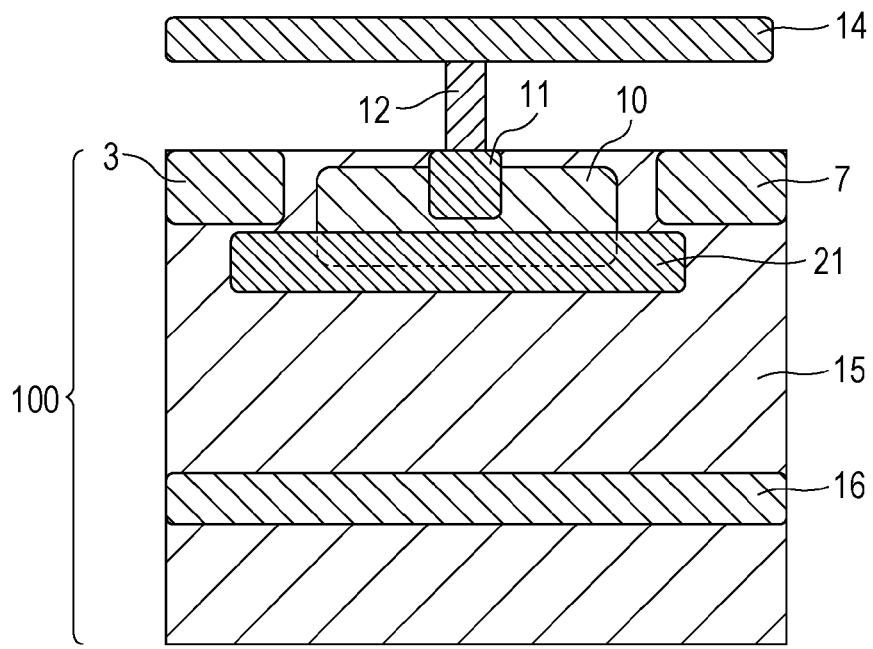
FIG. 8B is a diagram schematically illustrating a cross sectional structure of an imaging apparatus.

FIG. 8B is a diagram schematically illustrating a cross sectional structure of the imaging apparatus of the present embodiment. FIG. 8B schematically illustrates the cross sectional structure along a line I-J in FIG. 7. Elements of FIG. 8B corresponding to those illustrated in any of FIGS. 1 through 7 are designated by the same reference numerals as FIGS. 1 through 7.

As illustrated in FIG. 8B, the P-type semiconductor region 21 is wider than the channel region 10 in the channel width direction. In the present embodiment, P-type semiconductor region 21 extends to the extent that the P-type semiconductor region 21 reaches a region directly under the FD region 3 and a region directly under the source region 7 of the reset MOS transistor.

The cross sectional structure along a line K-L in FIG. 7 is the same as those of the first embodiment. That is to say, FIG. 3B schematically illustrates the cross sectional structure of the present embodiment.

According to the above described configuration, electrical resistance between the channel region 10 and the N-type semiconductor region 15 may be high. As a result, it is possible to reduce a parasitic current which runs through a region other than the channel defined by the gate region 9 and the channel region 10. Since the dependency of the parasitic current on the gate voltage is low, a large parasitic current may deteriorate the current-voltage characteristic of the JFET. Thus, reducing the parasitic current may improve the current-voltage characteristic of the JFET.

An impurity density of the P-type semiconductor region 21 may be lower than that of the buried gate region 9-2. In this configuration, even though there could be alignment error when forming the P-type semiconductor region 21, fluctuations in the electrical characteristic of the JFET may be reduced.

A manufacturing method of the imaging apparatus of the present embodiment further includes a step to form the P-type semiconductor region 21 in addition to the method explained in the first embodiment. The P-type semiconductor region 21, for example, may be formed by using a mask illustrated in FIG. 7.

As described above, according to the present embodiment, the parasitic JFET current may be reduced in addition to obtaining technical effect of the first embodiment.

Third Embodiment

Now, another embodiment will be described. Difference with the first embodiment or the second embodiment is that the JFET includes an LDD structure. The explanation will focus on the differences with the first and/or embodiments, and the explanation on the same structure as the first and/or second embodiments will be omitted.

A planar structure of an imaging apparatus of the present embodiment is the same as the first or second embodiment. That is to say, FIG. 1 or FIG. 7 schematically illustrates the planar structure of the imaging apparatus of the present embodiment. In the present embodiment, an N-type semiconductor region is added to a region which overlaps with the gate regions of FIG. 1 or FIG. 7.

Figure 9A:
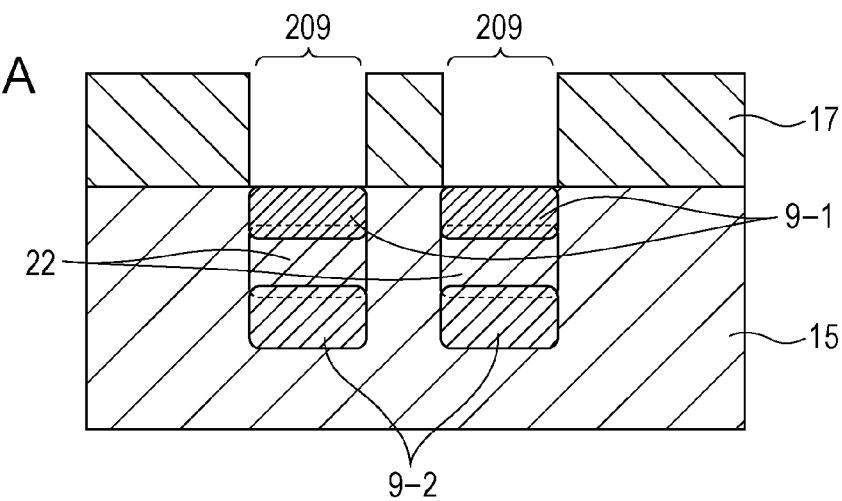
FIGS. 9A-9C are diagrams used to explain a manufacturing method of an imaging apparatus.
Figure 9B:
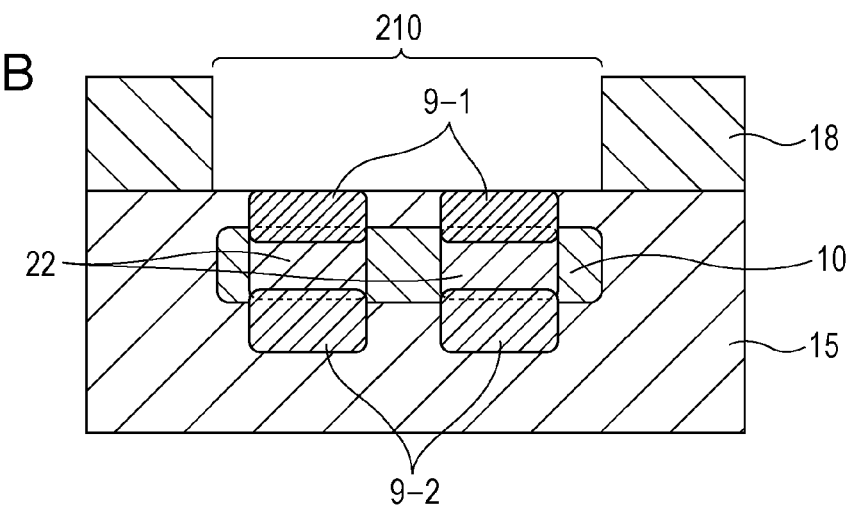
Figure 9C:
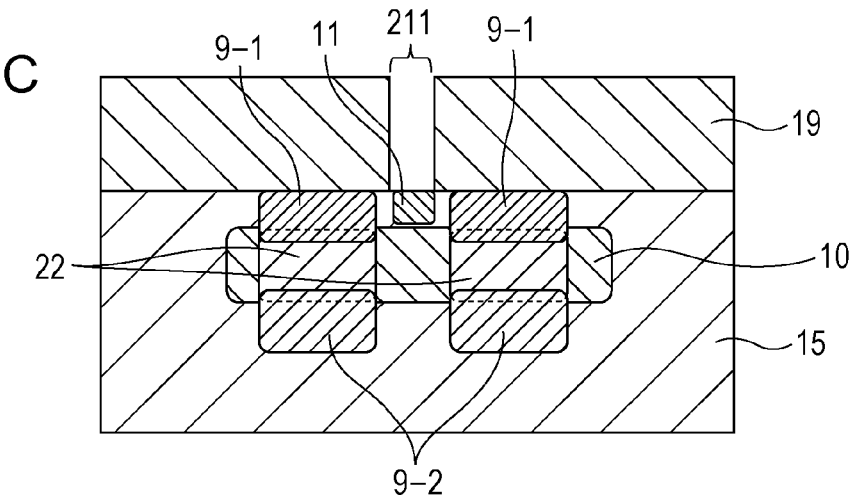

FIGS. 9A-9C are diagrams used to explain a manufacturing method of the imaging apparatus of the present embodiment. Each of FIGS. 9A-9C schematically illustrates a cross sectional structure along a line A-B in FIG. 1, which is a cross section including the channel length direction of the JFET. The P-type semiconductor region 21 may be added into the structure illustrated in FIGS. 9A-9C.

In a step illustrated in FIG. 9A, the surface gate region 9-1 and the buried gate region 9-2 are formed. A forming method of the surface gate region 9-1 and the buried gate region 9-2 is the same as those illustrated in FIG. 4A of the first embodiment. As described in the explanation of the first embodiment, the first mask 17 which defines the first opening 209 is used in this step.

In the present embodiment, an N-type semiconductor region 22 is formed using the first mask 17 which has been used or is to be used to form the surface gate region 9-1 and the buried gate region 9-2. Impurities to be donors, such as phosphorus and arsenic, are doped into the semiconductor substrate 100 through the first opening 209, whereby the N-type semiconductor region 22 is formed in a region corresponding to the first opening 209.

The first mask 17 is, for example, obtained by patterning a photoresist by photolithography method. Otherwise, the first mask 17 may be a hard mask.

The N-type semiconductor region 22 overlaps with the gate region 9 when viewed in a planar view. In other words, an orthogonal projection of the N-type semiconductor region 22 onto a plane parallel to the surface of the semiconductor substrate 100 is identical to the orthogonal projection of the gate region 9 onto the plane. The N-type semiconductor region 22 is arranged, located, positioned, or disposed at a depth between the surface gate region 9-1 and the buried gate region 9-2. The surface gate region 9-1, the buried gate region 9-2 and the N-type semiconductor region 22 may be formed by ion implantations. In that case, the implantation energies used to form the surface gate region 9-1, the buried gate region 9-2 and the N-type semiconductor region 22 may be adjusted so that the N-type semiconductor region 22 is arranged, located, positioned, or disposed at the depth between the surface gate region 9-1 and the buried gate region 9-2.

In a step illustrated in FIG. 9B, the channel region 10 of the JFET is formed. Since the step to form the channel region 10 is the same as those in the first embodiment, the explanation in detail will be omitted here.

In a step illustrated in FIG. 9C, the source region 11 is formed. Since the step to form the source region 11 is the same as those in the first embodiment, the explanation in detail will be omitted here.

A part, which has not been doped with impurities in the step illustrated in FIG. 9A, of the channel region 10 functions as a potential grading region (or, electric-field alleviation region). The channel is formed in a region where the channel region 10 and the N-type semiconductor region 22 overlap with each other. Impurities are doped into the region during each of the two steps of forming the channel region 10 and of forming the N-type semiconductor region 22. Accordingly, the other part of the channel region, i.e. the part which has not been doped with impurities in the step illustrated in FIG. 9A has a relatively low impurity density. Thus, it is possible to decrease an impurity density of a part of the channel region 10, which protrudes out of the gate region 9.

According to the low impurity density drain, an electric field near the drain of the JFET may be alleviated. If a large electric field is generated in the vicinity of the drain of the JFET, the channel current causes impact-ionization, and thus, generates carriers. The generated carriers may run into the gate region 9 that accumulates signal carriers, whereby noise may be generated. The alleviation of the electrical field around the drain of the JFET may prevent the impact-ionization which causes a noise. As a result, noises in the pixel may be reduced.

Generally, the channel current of the JFET causes the impact-ionization in a pinch-off region near the drain region. To alleviate the electrical field of the pinch-off region and prevent the impact-ionization, a low impurity density of the drain region may be used.

In the present embodiment, the channel of the JFET may be formed by only the N-type semiconductor region 22 without forming the channel region 10. In this case, a part of the N-type semiconductor region 15 forms the drain region. Without the channel region 10, the channel width of the JFET is defined as a distance between the FD region 3 and the source region 7 of the reset MOS transistor along the channel width direction.

As described above, according to the present embodiment, noises may be reduced in addition to obtaining technical effect of the first embodiment.

Fourth Embodiment

Figure 10:
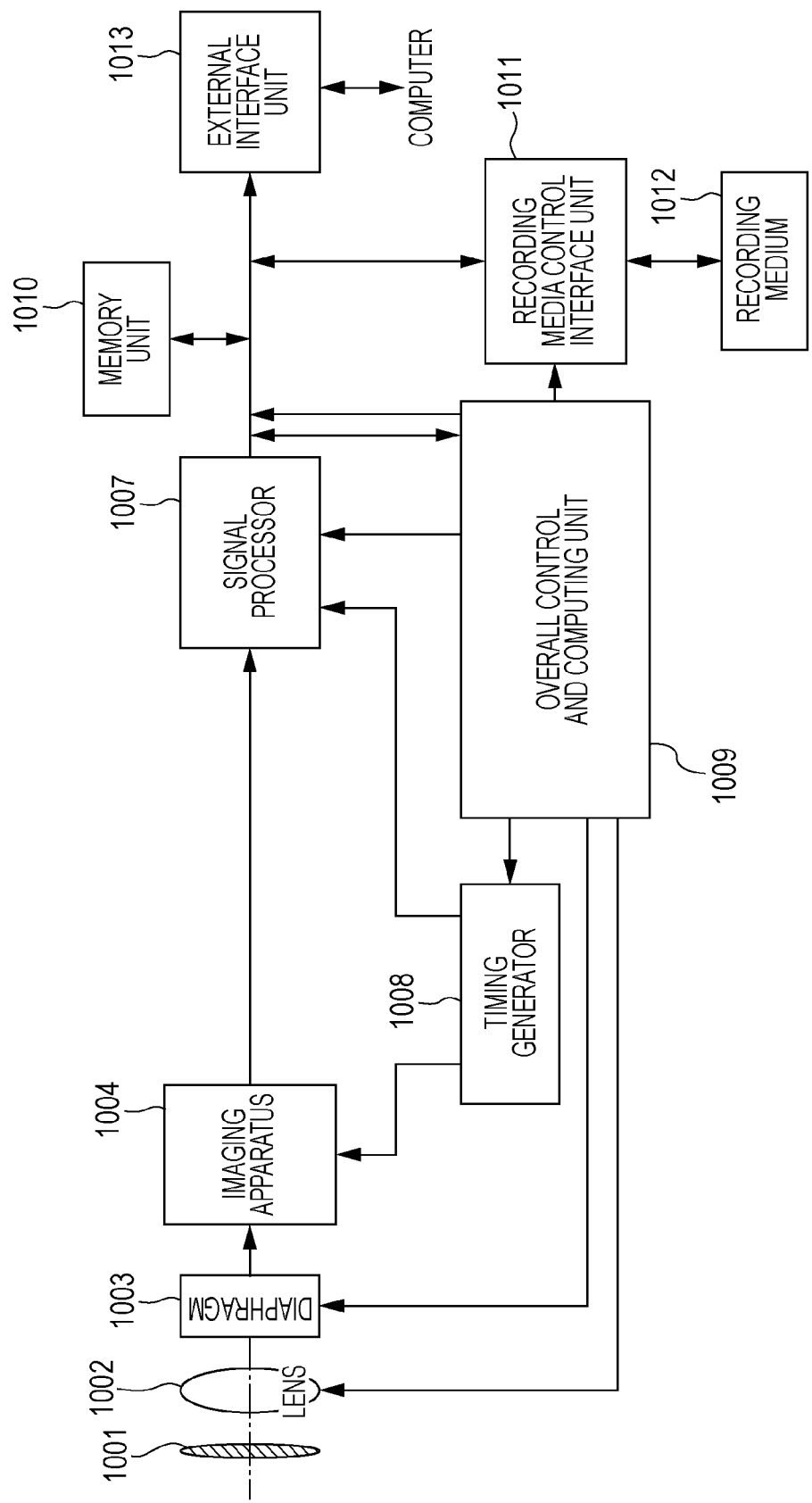
FIG. 10 is a block diagram of an imaging system.

An imaging system according to an embodiment of the present disclosure will be described. Examples of the imaging system include digital still cameras, digital camcorders, copiers, facsimiles, mobile phones, in-vehicle cameras, and orbiting satellites. FIG. 10 illustrates a block diagram of a digital still camera serving as an example of the imaging system.

In FIG. 10, a reference numeral 1001 denotes a barrier for lens protection, 1002 denotes a lens causing the imaging apparatus 1004 to perform focusing on an optical image of a photographic subject, and 1003 denotes a diaphragm configured to change the amount of light passing through the lens 1002. A reference numeral 1004 denotes an imaging apparatus described in the above embodiments, and is configured to convert the optical image formed by the lens 1002 as image data. Now, let us say that an analog-to-digital (AD) conversion unit is formed on a semiconductor substrate of the imaging apparatus 1004. A reference numeral 1007 denotes a signal processor configured to subject imaged data output by the imaging apparatus 1004 to various types of correction or to compress the imaged data. In FIG. 10, a reference numeral 1008 denotes a timing generator configured to output various types of timing signals to the imaging apparatus 1004 and signal processor 1007, and 1009 denotes an overall control unit configured to control the entire digital still camera. A reference numeral 1010 denotes a frame memory unit configured to temporarily store image data, 1011 denotes an interface unit configured to perform recording or readout on a recording medium, and 1012 denotes a recoding medium capable of connecting to and disconnecting from the imaging apparatus 1004, such as semiconductor memory or the like, configured to preform recording or readout of imaged data. Also, a reference numeral 1013 denotes an interface unit configured to communicate with an external computer or the like. Here, a timing signal or the like may be input from the outside of the imaging system. The imaging system has to include at least the imaging apparatus 1004, and the signal processor 1007 configured to process the imaged signal output from the imaging apparatus 1004.

A configuration has been described in the present embodiment wherein the imaging apparatus 1004 and AD conversion unit are provided to a different semiconductor substrate. However, the imaging apparatus 1004 and AD conversion unit may be formed on the same semiconductor substrate.

Also, the imaging apparatus 1004 and signal processor 1007 may be formed on the same semiconductor substrate.

Also, the signal processor 1007 may be configured to process a signal based on an electric carrier generated at the first photoelectric conversion unit, and a signal based on an electric carrier generated at the second photoelectric conversion unit to obtain distance information from the imaging apparatus 1004 to a subject.

The imaging apparatus according to one of the first embodiment through the third embodiment is employed as the imaging apparatus 1004 in the imaging system according to the present embodiment. Thus, fluctuations of the characteristic of the JFET may be reduced by applying an embodiment of the present disclosure to an imaging system.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of PCT/JP2013/084566, filed Dec. 25, 2013, which is hereby incorporated by reference herein in its entirety.

What is claimed is:

1. An imaging apparatus comprising:
a plurality of pixels, each pixel including a junction type field effect transistor provided in a semiconductor substrate,
wherein
the junction type field effect transistor includes a gate region and a channel region,
an orthogonal projection of the gate region onto a plane parallel to a surface of the semiconductor substrate intersects an orthogonal projection of the channel region onto the plane,
a length of the orthogonal projection of the channel region in a channel length direction is greater than a total length of the orthogonal projection of the gate region in the channel length direction, and
each of a source-side portion of the orthogonal projection of the channel region and a drain-side portion of the orthogonal projection of the channel region protrudes out of the orthogonal projection of the gate region,
each of first and second parts of the orthogonal projection of the gate region protrudes out of a periphery of the orthogonal projection of the channel region in a channel width direction toward opposite directions to each other;
the gate region includes a surface gate region in a surface side of the semiconductor substrate and a buried gate region disposed at different depths from each other,
the channel region is disposed between the surface gate region and the buried gate region, and
an orthogonal projection of the surface gate region onto the plane is identical to an orthogonal projection of the buried gate region onto the plane.

2. The imaging apparatus according to claim 1, wherein
the gate region includes a plurality of sub-regions which are disposed to sandwich a source region of the junction type field effect transistor and are electrically connected to each other,
each of orthogonal projections of the sub-regions onto the plane intersects the orthogonal projection of the channel region.

3. The imaging apparatus according to claim 1, wherein
a periphery of the orthogonal projection of the gate region includes two lines parallel to each other, and
a periphery of the orthogonal projection of the channel region includes two lines parallel to each other.

4. An imaging system comprising:
the imaging apparatus according to claim 1; and
a signal processing unit configured to process a signal output from the imaging apparatus.

5. An imaging apparatus comprising:
a plurality of pixels, each pixel including a junction type field effect transistor provided in a semiconductor substrate,
wherein
the junction type field effect transistor includes a surface gate region in a surface of the semiconductor substrate, a buried gate region and a channel region, disposed at different depths from each other,
the channel region is disposed between the surface gate region and the buried gate region,
each of an orthogonal projection of the surface gate region onto a plane parallel to a surface of the semiconductor substrate and an orthogonal projection of the buried gate region onto the plane intersects an orthogonal projection of the channel region onto the plane,
a length of the orthogonal projection of the channel region in a channel length direction is greater than a total length of the orthogonal projection of the surface gate region in the channel length direction and greater than a total length of the orthogonal projection of the buried gate region in the channel length direction,
each of first and second parts of the orthogonal projection of the surface gate region protrudes out of a periphery of the orthogonal projection of the channel region in a channel width direction toward opposite directions to each other, and
each of first and second parts of the orthogonal projection of the buried gate region protrudes out of the periphery of the orthogonal projection of the channel region in a channel width direction toward opposite directions to each other.

6. The imaging apparatus according to claim 5, wherein
the surface gate region includes a plurality of sub-regions which are disposed to sandwich a source region of the junction type field effect transistor and are electrically connected to each other,
each of orthogonal projections of the sub-regions onto the plane intersects the orthogonal projection of the channel region.

7. The imaging apparatus according to claim 5, wherein
the buried gate region includes a plurality of sub-regions which are disposed to sandwich a source region of the junction type field effect transistor and are electrically connected to each other,
each of orthogonal projections of the sub-regions onto the plane intersects the orthogonal projection of the channel region.

8. An imaging system comprising:
the imaging apparatus according to claim 5; and
a signal processing unit configured to process a signal output from the imaging apparatus.

* * * * *